United States Patent [19]

Nanpei et al.

[11] 4,188,221

[45] Feb. 12, 1980

[54] PHOTOSENSITIVE POLYAMIDE RESIN COMPOSITION USEFUL FOR MAKING RELIEF PRINTING PLATE

[75] Inventors: Masaru Nanpei; Toshiaki Fujimura; Hajime Kouda; Yoshihiro Kasho; Kuniomi Etoh, all of Otsu, Japan

[73] Assignee: Toyo Boseki Kabushiki Kaisha, Japan

[21] Appl. No.: 904,168

[22] Filed: May 8, 1978

[30] Foreign Application Priority Data

May 14, 1977 [JP] Japan ................................. 52-55744

[51] Int. Cl.² ................................................ G03C 1/68
[52] U.S. Cl. ..................................... 430/288; 430/306; 430/906; 204/159.16; 204/159.22
[58] Field of Search ................ 96/115 P, 115 R, 35.1, 96/35; 204/156.16, 159.22

[56] References Cited

U.S. PATENT DOCUMENTS

| | | | |
|---|---|---|---|
| 3,661,576 | 5/1972 | Crary | 96/35.1 |
| 3,676,145 | 7/1962 | Protzman | 96/115 R |
| 4,043,819 | 8/1977 | Baumann | 96/115 P |

*Primary Examiner*—John D. Welsh
*Attorney, Agent, or Firm*—Jones, Tullar & Cooper

[57] ABSTRACT

Photosensitive polyamide resin composition which can be developed with water to give a relief printing plate having an excellent moisture resistance, comprising 30 to 90% by weight of a water-soluble polyamide having ammonium type nitrogen atoms and 5 to 70% by weight of a photopolymerizable unsaturated compound prepared by reacting (meth)acrylic acid (I) and a polyglycidyl ether of an aliphatic polyvalent alcohol (II) in an equivalent ratio of $0.5 \leq (I)/(II) \leq 2.0$, and 0.01 to 10% by weight of a photopolymerization initiator.

16 Claims, No Drawings

PHOTOSENSITIVE POLYAMIDE RESIN COMPOSITION USEFUL FOR MAKING RELIEF PRINTING PLATE

The present invention relates to a photosensitive polyamide resin composition useful for making a relief printing plate. More particularly, it relates to a photosensitive polyamide resin composition which can be developed with water to give a relief printing plate having an excellent moisture resistance.

There has, hitherto, been known photosensitive resin compositions comprising a soluble polymer, an unsaturated monomer having one or more polymerizable double bonds (photopolymerizable unsaturated compound), and a photopolymerization initiator and optionally a thermopolymerization inhibitor. It is widely practiced to prepare a relief printing plate useful for printing by exposing an original plate of a photosensitive resin which is prepared by adhering a plate, foil or film of a photosensitive resin composition to a support to an active light through a negative film having a transparent image so as to cure and make insoluble the photosensitive resin composition at the exposed part and then removing off the photosensitive resin composition at the non-exposed part with a suitable solvent. Particularly, a photosensitive resin composition containing a soluble polyamide as a filling polymer has excellent printability and other properties after photopolymerization.

However, in the conventional printing plate made from a photosensitive polyamide resin composition, the non-exposed part of the resin layer should be removed by a solvent comprising expensive ethyl alcohol or methyl alcohol. Use of such a solvent has various defects, such as inferior handling, inferior storage properties, difficult treatment of the waste liquid, requirement of an expensive explosion-proof developing machine, or the like.

In order to eliminate these defects in the conventional printing plate of a photosensitive polyamide resin, the present inventors have provided a water-soluble polyamide containing ammonium type nitrogen atoms which can be developed with water.

Besides, an unsaturated monomer having a polymerizable double bond at the terminal is used as a photopolymerizable unsaturated compound in the preparation of a printing plate of a photosensitive polyamide resin, but the unsaturated monomer is usually inferior in the compatibility with the polyamide resin, and hence, it is difficult to incorporate the monomer in a large amount. On the other hand, unless the photosensitive resin composition is incorporated with a large amount of the photopolymerizable unsaturated compound, the composition has an inferior sensitivity to a photo-reaction and tends to show inferior physical properties and solvent resistance after photopolymerization. Accordingly, in order to obtain an excellent printing plate of a photosensitive polyamide resin composition, it is very important to find a photopolymerizable unsaturated compound having an excellent compatibility with the polyamide. As such a photopolymerizable unsaturated compound, there have been proposed N,N'-m-xylylene-bis(meth)acrylamide, N,N'-m-phenylene-bis(meth)acrylamide, diether prepared by reacting ethylene glycol and N-methylol(meth)acrylamide, or the like. However, these photopolymerizable unsaturated compounds have a limited compatibility with the polyamide having ammonium type nitrogen atoms and can not be incorporated into the photosensitive resin composition in a large amount. The photosensitive resin composition incorporated with such a low amount of the photopolymerizable unsaturated compound has a low photosensitivity and an exposure to a light for a long period of time is required in order to sufficiently cure and make insoluble the photosensitive resin composition. When the photosensitive resin composition is exposed to a light for a long period of time, the relief printing plate thus obtained has a dull, roundish edge at the section thereof, and hence, when such a relief printing plate is used for a printing, the lines of the printed image are wholly thick and are not sharp, and in case of letter image, the gap between lines of the letter image is occasionally filled up with the printing ink. On the other hand, when the amount of the photopolymerizable unsaturated compound is increased in order to increase the photosensitivity of the composition, the resulting photosensitive resin composition has a low transparency, and hence, when the composition is exposed to a light, irregular reflection of light occurs to proceed the photopolymerization reaction even at an unnecessary part. As the result, the relief printing plate has also a dull, roudish edge at the section thereof, and hence, when such a relief printing plate is used for printing, there can not be obtained a sharp printing image, either.

Moreover, although the polyamide having ammonium type nitrogen atoms can be developed with water because of a large polarity thereof, it has unfavorably large moisture-absorption characteristics. When a relief printing plate is prepared from a photosensitive resin composition containing as a filling polymer a polyamide having ammonium type nitrogen atoms, the composition absorbs water and swollen during the development thereof with water, which results in deformation of the relief image or disappearance of small lines or points. Besides, the moistened relief printing plate has a lower hardness, and hence, the relief is easily deformed under printing pressure, which results in dull image or distortion of small lines in the printed image, or filling up of the gap between lines of letter image.

As a result of the present inventors' extensive study, it has been found that a photosensitive resin composition comprising a polyamide having ammonium type nitrogen atoms and a specific photopolymerizable unsaturated compound can be developed with pure water and can give a relief printing plate having an excellent moisture resistance.

An object of the present invention is to provide an improved photosensitive polyamide resin composition which can be developed with pure water without being swollen and is useful for preparing a relief printing plate.

Another object of the invention is to provide an improvement of the properties of the photosenstive polyamide resin composition using a specific photopolymerizable unsaturated compound.

A further object of the invention is to provide a relief printing plate made from a photosensitive resin composition comprising a polyamide having ammonium type nitrogen atoms and a specific photopolymerizable unsaturated compound. These and other objects of the invention will be apparent from the following description.

The photosensitive resin composition useful for making a relief printing plate of the present invention comprises 30 to 90% by weight of a water-soluble polyamide having ammonium type nitrogen atoms and 5 to 70% by weight of a photopolymerizable unsaturated compound, said photopolymerizable unsaturated compound being prepared by reacting (meth)acrylic acid (I) and a polyglycidyl ether of an aliphatic polyvalent alcohol (II) in an equivalent ratio of $0.5 \leq (I)/(II) \leq 2.0$. "Equivalent ratio" means a ratio between functional groups contained in both compounds, i.e. a ratio of carboxyl group in (I) to glycidyl group(s) in (II). The photosensitive resin composition contains usually 0.01 to 10% by weight of a photopolymerization initiator.

The photosensitive resin composition of the present invention can give an excellent relief printing plate by exposing a photosensitive material comprising a layer of the photosensitive resin composition and a support therefor to an active light through a negative film having a transparent image and then removing off the photosensitive resin composition at the non-exposed part with water.

The relief printing plate thus obtained has excellent moisture resistance and solvent resistance and shows stable mechanical characteristics without decrease of hardness due to moisture absorption, and hence, when the relief printing plate is used for printing, the relief image does not distort even under the printing pressure to give an excellent print which is sharp even in the delicate lines or points of the image. Besides, since the composition of the present invention has a far higher transparency than that of the composition containing the conventional photopolymerizable unsaturated compound, the exposure is carried out without undesirable irregular reflection of light because of the excellent light permeability, and hence, only the necessary part of the composition exposed to a light is cured and made insoluble to give a sharp relief image.

Moreover, since the photopolymerizable unsaturated compound used in the present invention has an excellent compatibility with the polyamide and a large amount of the photopolymerizable unsaturated compound can be uniformly incorporated into the composition, the resin composition has a high photosensitivity and can sufficiently be cured and made insoluble within a short period of time to give a sharp image. The resin composition of the present invention can be formed into the photosensitive original plate at a lower temperature, and hence, an unnecessary heat history can be avoided. Accordingly, the addition amount of a thermopolymerization inhibitor can be decreased, by which the storage stability of the photosensitive original plate before exposure to light can be improved.

The relief printing plate of the present invention can also be used for the preparation of a patern plate which requires particularly a high moisture resistance. In the field of newspaper and weekly issued magazines wherein an extremely large amount of print is required within a short period of time, a plenty of printing plates are usually prepared from a single original plate by a technique of preparation of a patern plate. The technique of the preparation of a patern plate is carried out by piling up a paper (pulp) for a patern plate containing about 15% by weight of water onto the surface of a relief plate, sandwiching the piled plate between two plates, giving a pressure thereto from both sides to give a patern plate, wherein the part corresponding to the image of the relief plate is dented, drying the resulting patern plate, pouring molten lead alloy onto the surface of the patern plate and cooling the resultant to give a printing plate of lead alloy. The relief plate used for the preparation of a patern plate is required to have an extremely high moisture resistance. When a relief plate having an inferior moisture resistance is used, the edge of the relief is distorted and becomes roundish during the preparation of a patern plate and hence there can not be obtained the desired printing plate having a sharp image.

The photopolymerizable unsaturated compound used in the present invention is a reaction product of (meth)acrylic acid and a polyglycidyl ether of an aliphatic polyvalent alcohol. The reaction product may be used after removing the unreacted starting materials, but may usually be used as it is, i.e. without removing the unreacted materials. Other compound having at least one photopolymerizable unsaturated bond may optionally be added to the reaction system. The (meth)acrylic acid (I) and the polyglycidyl ether of an aliphatic polyvalent alcohol (II) may be used in an equivalent ratio of $0.5 \leq (I)/(II) \leq 2.0$, preferably $0.75 \leq (I)/(II) \leq 1.25$. When the equivalent ratio of (I)/(II) is less than 0.5 or over 2.0, the reaction product has an insufficient photoinsolubilizing effect and the relief printing plate obtained has an inferior moisture resistance after photopolymerization. The photopolymerizable unsaturated compound is used in an amount of 5 to 70% by weight, preferably 10 to 60% by weight, based on the total weight of the photosensitive resin composition.

The (meth)acrylic acid means methacrylic acid and acrylic acid.

The polyglycidyl ether of an aliphatic polyvalent alcohol has the following formula:

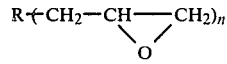

wherein R is a divalent, trivalent or tetravalent residue obtained by removing two to four hydrogen atoms from the two to four OH groups of a polyalkylene glycol having 1 to 20 carbon atoms or an aliphatic di- to tetravalent alcohol having 1 to 20 carbon atoms, and n is an integer of 2 to 4. Suitable examples of the polyglycidyl ether of an aliphatic polyvalent alcohol are ethylene glycol diglycidyl ether, diethylene glycol diglycidyl ether, triethylene glycol diglycidyl ether, diglycidyl ether of #200 polyethylene glycol, diglycidyl ether of #400 polyethylene glycol, propylene glycol diglycidyl ether, dipropylene glycol diglycidyl ether, diglycidyl ether of #200 polypropylene glycol, neopentyl glycol diglycidyl ether, 1,6-hexanediol diglycidyl ether, glycerine-1,3-diglycidyl ether, glycerine triglycidyl ether, 1,1,1-trimethylolethane triglycidyl ether, 1,1,1-trimethylolpropane triglycidyl ether, 1,1,1-trimethylol-2-methylpropane triglycidyl ether, pentaerythritol diglycidyl ether, pentaerythritol triglycidyl ether, pentaerythritol tetraglycidyl ether, or the like.

Particularly, when a glycidyl ether of an aliphatic tri- or tetra-valent alcohol of the formula:

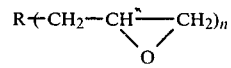

wherein R is a tri- or tetra-valent residue obtained by removing three or four hydrogen atoms from the three of four OH groups of an aliphatic tri- or tetra-valent alcohol having 1 to 10 carbon atoms, and n is an integer of 3 to 4, is used, the photosensitive resin composition has a high hardness and excellent moisture resistance, and hence, can be used for the preparation of a patern plate which is required particularly a high moisture resistance.

The reaction of the (meth)acrylic acid and the polyglycidyl ether of an aliphatic polyvalent alcohol may be carried out in the absence of a catalyst, but may preferably be carried out in the presence of a catalyst, such as a Lewis acid, a Lewis base, a tertiary amine, a quaternary ammonium salt, an organic acid, an acid anhydride, or the like. The catalyst is preferably used in an amount of 0.1 to 2.0% by weight based on the total weight of whole starting materials. The reaction temperature may be in the range of room temperature to 150° C., but when it is over 50° C., it is preferable to add a small amount of a conventional radical polymerization inhibitor, such as hydroquinones, quinones, phenothiazines, or the like. The reaction may be carried out in an inert solvent such as benzene or dioxane and then the solvent and unreacted starting materials are removed. However, the reaction may be carried out without using any solvent, i.e. only the starting materials are reacted, and then the reaction mixture may be used as it is for the preparation of the resin composition. It is not necessary to proceed the reaction in the rate of 100%, but the reaction mixture may contain a small amount of unreacted starting materials. Optionally, the epoxy group in the unreacted starting materials contained in the reaction mixture may be hindered with a mineral acid such as hydrochloric acid, and then, the resulting mixture may be used as it is for the preparation of the photosensitive resin composition.

A small amount of other compound having at least one photopolymerizable unsaturated bond may be used together with the photopolymerizable unsaturated compound without giving significantly undesirable effect on the properties of the composition. Examples of the other compound to be used together are (meth)acrylamide, N-methylol(meth)acrylamide, diacetone(meth)acrylamide, N-butyl(meth)acrylamide, methyl (meth)acrylate, 2-hydroxyethyl (meth)acrylate, 2-hydroxypropyl (meth)acrylate, tetrahydrofurfuryl (meth)acrylate, N,N'-methylenebis(meth)acrylamide, N,N'-trimethylenebis(meth)acrylamide, N,N'-hexamethylenebis(meth)acrylamide, N,N'-benzylidenebis(meth)acrylamide, N,N'-m-xylenebis(meth)acrylamide, tri(meth)acrylformal, ethylene glycol di(meth)acrylate, 1,3-propanediol di(meth)acrylate, trimethylolpropane tri(meth)acrylate, pentaerythritol tri(meth)acrylate, pentaerythritol tetra(meth)acrylate, tris[(meth)acryloyloxyethyl] phosphate, or the like.

The water-soluble polyamide having ammonium type nitrogen atoms used in the present invention includes all conventional water-soluble polyamide having ammonium type nitrogen atoms, for instance, the polyamide having as a base unit an ammonium type nitrogen atom of the formula:

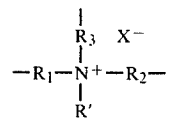

wherein $R_1$, $R_2$ and $R_3$ are each methylene or an alkylidene having 2 to 6 carbon atoms, or any two of $R_1$, $R_2$ and $R_3$ may form together with the nitrogen atom a piperazine ring, R' is hydrogen or a substituted or unsubstituted monovalent hydrocarbon having 1 to 12 carbon atoms, and $X^-$ is an anion of an inorganic or organic acid. When $R_2$ and $R_3$ in the above formula form a piperazine ring, the ammonium type nitrogen atom has the following formula:

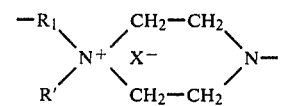

wherein R' and $R_1$ are as defined above. The ammonium type nitrogen atom (e.g. the above base unit) may preferably be contained in an amount of 0.35 to 7.0 equivalent/kg, more preferably 0.8 to 3.0 equivalent/kg, based on the weight of the polyamide, in the range of which the polyamide can give the desired resin composition having an excellent developability with water and further can give the desired relief printing plate having an excellent moisture resistance.

The polyamide having ammonium type nitrogen atoms may be prepared by reacting a polyamide having a basic tertiary amino group, for instance, the group of the formula:

wherein $R_1$, $R_2$ and $R_3$ are as defined above, and a quaternarizing agent which can convert the tertiary amino group into an ammonium type nitrogen atom.

The starting polyamides having basic tertiary amino groups are known and may be prepared by polymerizing a diamine (i.e. a compound having two polymerizable primary or secondary amino groups) and a dicarboxylic acid or its ester or halide, either or both of which have basic tertiary amino group(s) in the molecule, and optionally another monomer by a conventional method for the preparation of a polyamide such as polycondensation. Examples of the compounds having basic tertiary amino group(s) are diamines, such as N-(2-aminoethyl)piperazine, N-(3-aminopropyl)piperazine, N-(4-aminocyclohexyl)piperazine, N-(2-aminoethyl)-2,5-dimethylpiperazine, N,N'-bis(2-aminoethyl)piperazine, N,N'-bis(2-aminoethyl)methylpiperazine, N-(aminomethyl)-N'-(2-aminoethyl)piperazine, N,N'-bis(3-aminopropyl)piperazine, N,N-bis(2-aminoethyl)methylamine, N,N-bis(3-aminopropyl)cyclohexylamine, N,N'-dimethyl-N,N'-bis(3-aminopropyl)tetramethylenediamine, 6-methyl-6-(N,N-dimethylaminomethyl)-4,8-dioxa-1,11-undecandediamine, 6,6-bis(N,N-dimethylaminomethyl)-4,8-dioxa-1,11-undecanediamine; dicarboxylic acids, such as N,N'-bis(carboxymethyl)piperazine, N,N'-bis(2-carboxyethyl)piperazine, N-(2-carboxyethyl)-N'-(carboxymethyl)piperazine, N,N-bis(carboxymethyl)methylamine, N,N-bis(2-carboxyethyl)methylamine, N-carboxymethyl-N-(2-carboxyethyl)methylamine, N,N'-dimethyl-N,N'-bis(2-carboxyethyl)ethylenediamine, N,N'-dimethyl-N,N'-bis(3-carboxypropyl)hexamethylenediamine, or lower alkyl esters or acid halides of these dicarboxylic acids; ω-aminoacids, such as N-(2-carboxyethyl)piperazine, N-(4-carboxycyclohexyl)piperazine, N-(2-carboxyethyl)-2,5-dimethylpiperazine, N-(aminomethyl)-N'-(2-carboxyethyl)piperazine, N-(2-aminoethyl)-N'-(2-carboxyethyl)piperazine, N-(2-aminoethyl)-N-(2-carboxyethyl)methylamine, N-(3-aminopropyl)-N-(2-carboxyethyl)methylamine, N,N'-dimethyl-N-(2-aminoethyl)-N'-(2-carboxyethyl)ethylenediamine, N,N'-dimethyl-N-(aminomethyl)-N'-(carboxyethyl)hexamethylenediamine, or lower alkyl esters of these ω-amino acids, or the like, which may be used in combination of two or more thereof, but in case of ω-amino acids which contain both polymerizable amino group and carboxyl group in the molecule, they may be used alone. In addition to the compound, another conventional compounds, such as aliphatic or aromatic diamines, dicarboxylic acids, ω-amino acids, lactams, may be used together. The compound having tertiary amino group(s) in the molecule may preferably be used in an amount of 5 to 100% by mol, more preferably 10 to 100% by mol, based on the total polyamide component. When the amount of the compound is less than 5% by mol, the polyamide having ammonium type nitrogen atoms obtained therefrom has insufficient water-insolubility.

The quaternarizing agent used in the conversion of the tertiary amino group into the ammonium type nitrogen atom includes protonic acids, alkyl halides, a combination of epoxy compounds and protonic acids, for example, inorganic acids such as hydrochloric acid, hydrobromic acid, sulfuric acid, phosphoric acid; carboxylic acids such as formic acid, acetic acid, monochloroacetic acid, oxalic acid, adipic acid, maleic acid, fumalic acid, itaconic acid, phthalic acid, acrylic acid, methacrylic acid, succinic acid; organic sulfonic acids such as benzenesulfonic acid, p-toluenesulfonic acid; alkyl halides such as methyl chloride, methyl bromide, lauryl chloride; and further ethylene oxide, glycidyl acrylate, glycidy methacrylate, ethylene glycol methacrylate-o-carboxybenzoate, ethylene glycol acrylate-o-carboxybenzoate, ethylene glycol methacrylate-m-carboxybenzoate, ethylene glycol acrylate-p-carboxybenzoate, or the like. Among them, the quaternarizing agent having a polymerizable unsaturated bond, such as methacrylic acid, acrylic acid or ethylene glycol (meth-)acrylate-carboxybenzoate, are particularly preferable because these compounds act also as a photopolymerizable unsaturated compound and hence can enhance the photosensitivity of the resin composition. The amount of the quaternarizing agent may be varied with the amount of basic tertiary amino group contained in the polyamide and the water-solubility thereof, but is preferably in the range of 0.05 to 5 mol, more preferably 0.10 to 2.0 mol, per 1 mol of the basic tertiary amino group contained in the polyamide.

The photopolymerization initiator used in the present invention can act not only to initiate the photopolymerization reaction of the photopolymerizable unsaturated compound but also to promote or accelerate the reaction. The photopolymerization initiator includes all compounds which have been known as a photosensitizer for photopolymerization of an unsaturated compound compound, for instance, benzophenones, benzoins, benzils, anthraquinones, or the like, which may be used alone or in a combination of two or more thereof. The photopolymerization initiator may be used in an amount of 0.01 to 10% by weight, preferably 0.05 to 5% by weight, based on the weight of the photosensitive resin composition.

The photosensitive resin composition may optionally be contained a thermopolymerization inhibitor in order to prevent undesirable thermopolymerization during the preparation, molding or processing of the composition or undesirable dark reaction during the storage of the composition. The thermopolymerization inhibitor includes hydroquinones, benzoquinones, catechols, phenols, picric acids, naphthoquinones, phenothiazines, methylene blue, or the like. The thermopolymerization inhibitor may be used in an amount of 0 to 2% by weight based on the total weight of the photosensitive resin composition.

The photosensitive resin composition of the present invention may also contain other inactive materials, unless they do not affect on the transparency or photoreactivity of the composition. The other materials are, for instance, plasticizers, lubricants, fillers, or the like, which are added in order to improve the moldability of the composition.

The starting polyamide, photopolymerizable unsaturated compound and photopolymerization initiator are mixed in a conventional manner, for instance, by mixing them in molten state, by mixing in the form of a solution in an alcohol and then removing the solvent, or by mixing them as they stand at room temperature.

The photosensitive resin composition is formed into a sheet-like material to give an original plate of the photosensitive resin. The composition is subjected to a heat press, pouring into a mold, or melt extrusion to give a sheet-like materials, such as plate, film or foil having an appropriate thickness. The sheet-like material thus obtained is laminated onto a sheet-like support of steel, aluminum, iron, glass, plastic film, rubber or the like with or without an adhesive.

The original plate of a photosensitive resin thus obtained is piled up onto a negative or positive film having a transparent image and thereon an active light irradiates, by which only the exposed part is cured and made insoluble. In order to irradiate the active light, there are used various kinds of mercury lamp, carbon arc lamp, xenone lamp, ultraviolet fluorescent lamp, or the like. After the irradiation of light, the non-exposed part of the composition is removed with an appropriate solvent to give a relief printing plate having a sharp image. The solvent may be pure water, aqueous solution of various acids, a mixture of water and an alcohol, an aliphatic lower alcohol, a mixture of an aliphatic lower alcohol and calcium chloride or zinc chloride, or the like, but the water-soluble polyamide having ammonium type nitrogen atoms used in the present invention can be developed only by water. The removal of the non-exposed part may be carried out by spraying water, rubbing or brushing.

The plate obtained from the photosensitive resin composition has higher moisture resistance, and long press life after photopolymerization in comparison with the conventional resin composition and is useful for the preparation of a relief printing plate suitable for letterpress printing, indirect letterpress printing, dry offset printing and can give a highly presice, sharp printing image.

The present invention is illustrated by the following Examples but is not limited thereto. In Examples, "part" is part by weight, unless otherwise specified.

EXAMPLE 1

Ethylene glycol diglycidyl ether (epoxy group: 105 equivalent, 210 parts) and methacrylic acid (180.8 parts) were reacted in the presence of hydroquinone monomethyl ether (0.4 part) and tetramethylammonium iodide (4.4 parts) until the epoxy group substantially disappeared to give a liquid reaction product which was colorless and viscous (viscosity: 750 cps at 25° C.).

Separately, a water-soluble modified polyamide having an ammonium type nitrogen atom was prepared by reacting acrylic acid (5 parts) and terpolyamide having basic tertiary amino groups (55 parts) which was prepared by polycondensing ε-caprolactam (50 parts), a nylon salt of N,N'-bis(3-aminopropyl)piperazine with adipic acid (40 parts) and a nylon salt of hexamethylenediamine with adipic acid (10 parts).

The liquid reaction product (38.7 parts), the water-soluble modified polyamide (60 parts), benzoin methyl ether (1.0 part) and hydroquinone monomethyl ether (0.3 part) were dissolved in methanol (200 parts) with heating to give a uniform, transparent solution. The solution thus obtained was spreaded on a polytetrafluoroethylene sheet, air-dried in a dark place to remove the methanol, and further dried at 40° C. under reduced pressure for 16 hours. The uniform, transparent sheet of the photosensitive resin composition thus obtained was adhered with heating to a polyester sheet (thickness: 250μ) with a polyester adhesive to give an original plate having a layer of the photosensitive resin (thickness of 600μ). To the photosensitive layer of the original plate was adhered a negative film having letter and picture images, and exposed to a light with a 200 W chemical lamp for 3.5 minutes from a distance of 10 cm above the negative film. After the exposure, the negative film was peeled off, and the resulting plate was developed with neutral water at 30° C. under 3 atm. for 3 minutes to give a sharp relief plate having the presicely same images as the original. The relief plate was dried and exposed to a light for 5 minutes, and was used for printing. The prints thus prepared had a sharp image, in which the original image was reproduced accurately, and had excellent spreading and transferability of ink, long press life and resolution.

EXAMPLE 2

In the same manner as described in Example 1 except that a water and alcohol-soluble polyamide having ammonium type nitrogen atoms (60 parts) prepared by reacting acrylic acid (5 parts) and a polyamide having basic tertiary amino groups (55 parts) which was prepared by polycondensing ε-caprolactam (55 parts) and a nylon salt of N,N'-bis(3-aminopropyl)piperazine with adipic acid was used instead of the water-soluble modified polyamide (60 parts), there was obtained a uniform, transparent photosensitive resin composition. An original plate was prepared from the resin composition, and was subjected to exposure to a light, development with neutral water, drying and exposure to a light to give a relief plate having a sharp image, in which the original image was reproduced accurately. The relief plate was subjected to a printing test. As the result, it showed excellent spreading and transferability of ink, excellent long press life and resolution.

EXAMPLE 3

1,1,1-Trimethylolpropane triglycidyl ether (epoxy group: 112 equivalent, 336 parts) and acrylic acid (227 parts) were reacted in the presence of hydroquinone (0.4 part) and tetramethylammonium iodide (6.5 parts) until the epoxy group substantially disappeared to give a liquid reaction product which was faint yellow and viscous (viscosity: 16,200 cps at 25° C.).

Separately, a water and alcohol-soluble modified polyamide having ammonium type nitrogen atoms was prepared by reacting methacrylic acid (10 parts) and a homopolyamide (50 parts) which was prepared by polycondensing a nylon salt of 6-methyl-6-(N,N-dimethylaminomethyl)-4,8-dioxane-1,11-undecanediamine with adipic acid.

The liquid reaction product (38.4 parts), the water and alcohol-soluble modified polyamide (60 parts), benzophenone (1.5 parts) and hydroquinone (0.1 part) were dissolved in methanol (200 parts) with heating. The solution thus obtained was spreaded on a polytetrafluoroethylene sheet, air-dried in a dark place to remove methanol, and further dried at 40° C. under reduced pressure for 16 hours to give a uniform transparent sheet of a photo-sensitive resin composition. The sheet was adhered with heating to an aluminum plate (thickness: 300μ) with a polyester adhesive to give an original plate having a layer of the photosensitive resin (thickness: 600μ). The original plate was subjected to exposure to a light, development with neutral water, drying and exposure to a light to give a relief plate having a sharp image, in which the original image was reproduced accurately, in the same manner as described in Example 1. The relief plate was subjected to a printing test. As the result, there was obtained excellent prints. It showed excellent printing characteristics.

EXAMPLE 4

A nylon salt of N,N'-dicyclohexyl-N,N'-bis(2-carboxypropyl)hexamethylenediamine with hexamethylenediamine (35 parts) and a nylon salt of ethylenediamine with azelaic acid (65 parts) were copolymerized to give a water-insoluble polyamide having basic tertiary amino groups. The polyamide (52.2 parts) and methyl bromide (7.8 parts) were reacted in methanol (200 parts) to give a polyamide having ammonium type nitrogen atoms. In the resulting methanol solution containing the polyamide (60 parts) were dissolved with heating a reaction product of acrylic acid (I) and propylene glycol diglycidyl ether (II) (ratio of I/II: 1.03 equivalent, 35,7 parts), N,N'-methylenebisacrylamide (3.0 parts), benzoin methyl ether (1.0 part) and hydroquinone monomethyl ether (0.3 part). The resulting mixture was treated in the same manner as described in Example 1 to give an original plate, which was subjected to exposure to a light, development with neutral water, drying and exposure to a light to give a relief plate having a sharp image, in which the original image was reproduced accurately. The relief plate was subjected to a printing test. As the result, there was obtained a sharp print, in which the original image was reproduced accurately, and it showed excellent spreading and transferability of ink, excellent long press life and resolution.

EXAMPLE 5

A nylon salt of N-(2-aminoethyl)piperazine with adipic acid (40 parts), ε-caprolactam (30 parts) and a nylon salt of hexamethylenediamine with sebacic acid (30 parts) were copolymerized to give a terpolyamide having a basic tertiary amino group. The terpolyamide thus obtained (100 parts) was reacted with ethyleneglycol methacrylate-o-carboxybenzoate (47 parts) to give a water-soluble modified polyamide having ammonium type nitrogen atoms. The modified polyamide (100 parts) was dissolved with heating in methanol (300 parts), and thereto were added a reaction product of methacrylic acid (I) and ethyleneglycol diglycidyl ether (II) (ratio of I/II: 1.05 equivalent, 100 parts), benzophenone (2.0 parts) and hydroquinone monomethyl ether (0.3 part). A photosensitive resin sheet (thickness: 1000μ) was prepared from the mixture in a conventional manner.

The haze of the sheet was measured by a hazeometer S (made by Toyo Seiki Seisakusho), and it had a haze of 4.7%. On the other hand, a part of the sheet was exposed to a light with a 200 W chemical lamp from a distance of 10 cm for 2.0 minutes, by which the sheet was sufficiently cured. After the curing, the sheet was kept in a vessel at a relative moisture of 90%. After one week, it showed a Shore D hardness of 41.

REFERENCE EXAMPLE 1

In the same manner as described in Example 5 except that N,N'-m-xylylenebisacrylamide (100 parts) was used instead of the reaction product of methacrylic acid and ethylene glycol diglycidyl ether, there was obtained a solution of a photosensitive resin in methanol. A sheet was prepared from the solution in the same manner as in Example 5, but the sheet had a turbid surface owing to the precipitation of N,N'-m-xylylenebisacrylamide and hence could not be used as a photosensitive resin plate.

By changing the amount of N,N'-m-xylylenebisacrylamide to 35 parts, a photosensitive resin solution in methanol was prepared in the same manner as above, and then a sheet of the photosensitive resin (thickness: 1000μ) was prepared likewise. The sheet was tested on the haze and the exposure time necessary for sufficient curing in the same manner as in Example 5. As the result, it showed a haze of 32 and an exposure time of 10 minutes.

In the same manner as described in Example 1, an original plate of the photosensitive resin was prepared from the above photosensitive resin solution, and the original plate was subjected to exposure to a light (for 10 minutes), development with neutral water, drying and exposure to a light to give a relief plate. However, the relief plate thus obtained was unevenly cured and the image partially lacked.

Moreover, by changing the amount of N,N'-m-xylylenebisacrylamide to 30 parts, a photosensitive resin solution was prepared likewise, and then a sheet was prepared likewise. The sheet was tested on the haze, the exposure time necessary for sufficient curing and the Shore D hardness after keeping at a relative humidity of 90 % in the same manner as in Example 5. As the result, it showed a haze of 6.0%, an exposure time of 5 minutes and a Shore D hardness of 13.

EXAMPLE 6

In order to experimentally prove the excellent moisture resistance after photopolymerization of the photosensitive resin composition incorporated with the photopolymerizable unsaturated compound of the present invention in comparison with that of the photosensitive resin composition incorporated with the conventional photopolymerizable unsaturated compound, the following test was carried out.

The water and methanol-soluble modified polyamide having ammonium type nitrogen atoms (100 parts) used in Example 2 was dissolved with heating in methanol (300 parts), and thereto were added the photopolymerizable unsaturated compounds as shown in the following Table 1, benzophenone (2.0 parts) and hydroquinone monomethyl ether (0.3 part). A photosensitive resin sheet (thickness: 1000μ) was prepared from the mixture in a conventional manner.

The haze of the non-exposed sheet was measured by a hazeometer S (made by Toyo Seiki Seisakusho). The results are shown in Table 1.

A part of the non-exposed sheet was exposed to a light with a 200 W chemical lamp from a distance of 10 cm for 10 minutes. The resulting cured sheet was kept in a vessel at a relative humidity of 90 %. After one week, the Shore D hardness was measured. The results are shown in Table 1.

The remaining non-exposed sheet was adhered with heating to a polyester film (thickness: 250μ) with a polyester adhesive to give an original plate having a layer of the photosensitive resin composition (thickness: 600μ). In the same manner as described in Example 1, a relief printing plate was prepared by using the above original plate. The relief printing plate was kept in a vessel at a relative humidity of 90%. After one week, the plate was tested on the printing characteristics. The results are shown in Table 1, wherein the evaluation is as follows:

o: The original image was reproduced accurately.

x: The image in the print was dull and enlarged than the original image.

In comparison purpose, a photosensitive resin composition incorporated with a conventional photopolymerizable unsaturated compound was also tested on the hardness and printing characteristics. The results are also shown in Table 1.

In the above test, the accurate reproduction of the original image means that the relief printing plate has excellent printing characteristics, and on the other hand, the enlargement of the printed image occurs, because the hardness of the relief printing plate was remarkably decreased owing to the moisture absorption and hence the relief printing plate was deformed under the printing pressure, which means that the relief printing plate has an insufficient moisture resistance.

Table 1

| Test sample | Photopolymerizable unsaturated compound Kind | Amount | Haze of non-exposed sheet (%) | Shore D hardness of exposed sheet | Printing characteristics of relief printing plate |
|---|---|---|---|---|---|
| The present invention | | | | | |
| (1) | Reaction product of acrylic acid (I) and ethyleneglycol diglycidyl ether (II) (I/II: 1.05 equivalent) | 80 | 4.1 | 36 | o |
| (2) | Reaction product of methacrylic acid (I) and trimethylolpropane triglycidyl ether (II) (I/II: 1.07 equivalent) | 60 | 4.5 | 42 | o |
| (3) | Reaction product of acrylic acid (I) and propyleneglycol diglycidylether (II) | 65 | 5.6 | 39 | o |

Table 1-continued

| Test sample | Photopolymerizable unsaturated compound Kind | Amount | Haze of non-exposed sheet (%) | Shore D hardness of exposed sheet | Printing characteristics of relief printing plate |
|---|---|---|---|---|---|
| Comparative example | (I/II: 0.95 equivalent) | | | | |
| (4) | Diether of ethylene glycol and N-methylolacrylamide | 40 | 8.5 | 22 | x |
| (5) | Acrylamide, N,N'-methylenebisacrylamide N,N'-benzylidenebisacrylamide | 60 5 5 | 14.7 | 19 | x |

EXAMPLE 7

Pentaerythritol tetraglycidyl ether (epoxy group: 126 equivalent, 504 parts) and methacrylic acid (354 parts) were reacted in the presence of phenothiazine (0.18 part) and tetramethylammonium iodide (8.6 parts) until the epoxy group substantially disappeared to give a reaction product.

Separately, the water-insoluble but alcohol-soluble polyamide having basic tertiary amino groups (40 parts) used in Example 2 was reacted with methacrylic acid (5 parts) to give a water and alcohol-soluble, modified polyamide having ammonium type nitrogen atoms.

The reaction product obtained above (53.7 parts), the modified polyamide having ammonium type nitrogen atoms (45 parts), benzoin methyl ether (1.0 part) and hydroquinone monomethyl ether (0.3 part) were dissolved with heating in methanol (200 parts) to give a uniform transparent solution.

The solution thus obtained was spreaded onto a polytetrafluoroethylene sheet and air-dried in a dark place to remove methanol, and further dried at 40° C. for 16 hours. The uniform transparent sheet of the photosensitive resin composition thus obtained was adhered with heating to an iron plate (thickness: 250μ) with a polyester adhesive to give an original plate having a layer of the photosensitive resin composition (thickness: 950μ). To the photosensitive layer of the original plate was adhered a negative film having letter and picture images, and exposed to a light with a 200 W chemical lamp for 2.5 minutes from a distance of 10 cm above the negative film. After the exposure, the negative film was peeled off, and the resulting plate was developed with neutral water at 30° C. under 3 atm. for 2.5 minutes to give a sharp relief plate, in which the original image was reproduced accurately. The cured resin layer of the relief plate had a Shore D hardness of 86.

Onto the surface of the photosensitive resin layer of the relief plate was piled up a patern plate (thickness: 1620μ) which contained about 15% of moisture and the resulting plate was sandwiched with bakelite plate (thickness: 1600μ), and pressed under a linear pressure of 150 kg/cm from both sides to give a patern plate, in which the original image of the negative film and the original plate was reproduced accurately. In order to test the durability and reproducibility of the original plate in the preparation of the patern plate, the procedure of the preparation of patern plate as above was repeated 15 times. As the result, the compressibility of the patern plate was 44 to 48% (excellent), and the reproducibility was also excellent and no injury of the fine line or point of the image was observed.

What is claimed is:

1. A photosensitive polyamide resin composition useful for making a relief printing plate, which comprises 30 to 90% by weight of a water-soluble polyamide having ammonium type nitrogen atoms and 5 to 70% by weight of a photopolymerizable unsaturated compound prepared by reacting (meth)acrylic acid (I) and a polyglycidyl ether of an aliphatic polyvalent alcohol (II) in an equivalent ratio of $0.5 \leq (I)/(II) \leq 2.0$.

2. A photosensitive polyamide resin composition according to claim 1, wherein 0.01 to 10% by weight of a photopolymerization initiator is incorporated.

3. A photosensitive polyamide resin composition according to claim 1 or 2, wherein the polyglycidyl ether of an aliphatic polyvalent alcohol has the following formula:

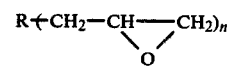

wherein R is a divalent, trivalent or tetravalent residue obtained by removing two to four hydrogen atoms from two to four OH groups of a polyalkylene glycol having 1 to 20 carbon atoms or an aliphatic di- to tetra-valent alcohol having 1 to 20 carbon atoms, and n is an integer of 2 to 4.

4. A photosensitive polyamide resin composition according to claim 3, wherein the polyglycidyl ether of an aliphatic polyvalent alcohol is ethylene glycol diglycidyl ether.

5. A photosensitive polyamide resin composition according to claim 3, wherein the polyglycidyl ether of an aliphatic polyvalent alcohol is 1,1,1-trimethylolpropane triglycidyl ether.

6. A photosensitive polyamide resin composition according to claim 3, wherein the polyglycidyl ether of an aliphatic polyvalent alcohol is pentaerythritol tetraglycidyl ether.

7. A photosensitive polyamide resin composition according to claim 1 or 2, wherein the polyglycidyl ether of an aliphatic polyvalent alcohol has the following formula:

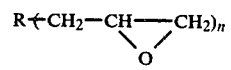

wherein R is a trivalent or tetravalent residue obtained by removing three or four hydrogen atoms from three or four OH groups of an aliphatic tri- or tetra-valent alcohol having 1 to 10 carbon atoms, and n is an integer of 3 to 4.

8. A photosensitive polyamide resin composition according to claim 1 or 2, wherein the photopolymerizable unsaturated compound is contained in an amount of 10 to 60% by weight.

9. A photosensitive polyamide resin composition according to claim 1 or 2, wherein the water-soluble polyamide has ammonium type nitrogen atoms of the following formula:

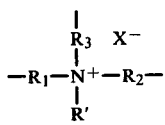

wherein $R_1$, $R_2$ and $R_3$ are each methylene, or an alkylidene having 2 to 6 carbon atoms, or any two of $R_1$, $R_2$ and $R_3$ may combine together with the nitrogen atom to form a piperazine ring; R' is hydrogen or a substituted or unsubstituted monovalent hydrocarbon having 1 to 12 carbon atoms; and $X^-$ is an anion of an inorganic or organic acid.

10. A photosensitive polyamide resin composition according to claim 9, wherein the polyamide contains the ammonium type nitrogen atoms in an amount of 0.35 to 7.0 equivalent/kg based on the weight of the polyamide.

11. A photosensitive polyamide resin composition according to claim 9, wherein the water-soluble polyamide having ammonium type nitrogen atoms is a polyamide prepared by reacting (meth)acrylic acid and a polyamide having basic tertiary amino groups which is prepared by polymerizing 10 to 100% by mol of a nylon salt of N,N'-bis(3-aminopropyl) piperazine with adipic acid, 0 to 90% by mol of ε-caprolactam and 0 to 90% by mol of a nylon salt of hexamethylenediamine with adipic acid.

12. A photosensitive polyamide resin composition according to claim 9, wherein the water-soluble polyamide having ammonium type nitrogen atoms is a polyamide prepared by reacting (meth)acrylic acid and a polyamide having basic tertiary amino groups which is prepared by polymerizing 10 to 100% by mol of a nylon salt of N-(2-aminoethyl) piperazine with adipic acid, 0 to 90% by mol of ε-caprolactam and 0 to 90% by mol of a nylon salt of hexamethylenediamine with adipic acid.

13. A photosensitive polyamide resin composition according to claim 9, wherein the water-soluble polyamide having ammonium type nitrogen atoms is a polyamide prepared by reacting (meth)acrylic acid and a polyamide having basic tertiary amino groups which is prepared by polymerizing 10 to 100% by mol of a nylon salt of N,N'-bis(3-aminopropyl)piperazine with sebacic acid, 0 to 90% by mol of ε-caprolactam and 0 to 90% by mol of a nylon salt of hexamethylenediamine with adipic acid.

14. A photosensitive polyamide resin composition according to claim 9, wherein the water-soluble polyamide has ammonium type nitrogen atoms of the formula:

$$-R_1\diagdown_{\diagup}^{N^+}\diagup_{\diagdown}^{CH_2-CH_2}\diagdown_{\diagup}N-$$
$$R' \quad X^- \quad CH_2-CH_2$$

wherein $R_1$ is methylene or an alkylidene having 2 to 6 carbon atoms, R' is hydrogen or a substituted or unsubstituted monovalent hydrocarbon group having 1 to 12 carbon atoms, and $X^-$ is an anion of an inorganic or organic acid.

15. A photosensitive article useful in forming a relief printing plate comprising a layer of the composition of claim 1 on a support layer.

16. In a method of forming a relief printing plate which comprises exposing a portion of a layer of a photopolymerizable composition to active light the improvement which comprises employing the composition of claim 1 as the photopolymerizable composition and developing the exposed photopolymerized layer with water.

* * * * *